April 17, 1973 J. G. HOFFMAN ET AL 3,728,090

SEMICONDUCTOR BONDING ALLOY

Filed June 30, 1970 2 Sheets-Sheet 1

April 17, 1973 J. G. HOFFMAN ET AL 3,728,090

SEMICONDUCTOR BONDING ALLOY

Filed June 30, 1970 2 Sheets-Sheet 2

INVENTORS:
JOE G. HOFFMAN
DONALD J. MANUS

United States Patent Office 3,728,090
Patented Apr. 17, 1973

3,728,090
SEMICONDUCTOR BONDING ALLOY
Joe G. Hoffman, Richardson, and Donald J. Manus, Dallas, Tex., assignors to Texas Instruments Incorporated, Dallas, Tex.
Filed June 30, 1970, Ser. No. 51,253
Int. Cl. B32b 15/04
U.S. Cl. 29—195 3 Claims

ABSTRACT OF THE DISCLOSURE

A bonding alloy for semiconductors and the like comprises a ternary alloy containing aluminum, germanium and zinc. The preferred embodiment of the invention comprises the aluminum-germanium-zinc ternary eutectic alloy which melts at 370° C. and which includes 20 wt. percent aluminum, 23 wt. percent germanium and 57 wt. percent zinc. In the use of the invention, a quantity of aluminum-germanium-zinc alloy material is positioned between a semiconductor device and a device receiving member. The resulting assembly is then heated to above the melting temperature of the alloy material, whereupon the alloy material bonds the semiconductor device to the device receiving member.

This invention relates to a bonding alloy, and more particularly to an alloy comprising aluminum, germanium and zinc.

At the present time, the aluminum-germanium eutectic alloy is employed to bond electronic devices to device receiving members, such as headers, etc. This material is generally satisfactory for this purpose in that it melts at 424° C., and in that it forms a strong bond between electronic devices and device receiving members. However, some electronic devices are damaged by temperatures above 400° C. Also, in some manufacturing operations, it is desirable to mount subassemblies including components bonded with the aluminum-germanium eutectic alloy. Thus, a need exists for a bonding material having a melting temperature in the range of about 370° C. To be acceptable, such a material must adhere readily both to electronic devices and to device receiving members, exhibit good mechanical strength, and be adaptable to high volume manufacturing processes.

By reference to the Periodic Table of the Elements, almost all of the elements can be eliminated as possible constituents of such a bonding material, either because they have high melting points, or because they tend to form compounds having high melting points. The remaining elements, that is, the elements that melt at relatively low temperatures and that form binary eutectics having low melting temperatures include aluminum, gallium, germanium, magnesium, silicon and zinc. Prior studies of alloys comprising these elements have included investigations of the aluminum-magnesium-zinc ternary system, the aluminum-magnesium-silicon ternary system, the aluminum-magnesium-germanium ternary system, the aluminum-germanium-silicon ternary system, and the aluminum-silicon-zinc ternary system. However, with the exception of a zinc-rich aluminum-magnesium-zinc eutectic that melts at 343° C., none of these systems includes an alloy having a melting temperature below that of the aluminum-germanium eutectic alloy.

The present invention relates to an alloy comprising aluminum, germanium and zinc. It has been found that these elements forms a ternary eutectic alloy comprising 20 wt. percent aluminum, 23 wt. percent germanium, and 57 wt. percent zinc. The ternary eutectic alloy melts at 370° C. and fulfills the remaining requirements of a useful bonding material for electronic devices. That is, the ternary alloy adheres readily both to electronic devices and to device receiving members, exhibits good mechanical strength, and is adaptable to high volume manufacturing processes.

A more complete understanding of the invention may be had by referring to the following detailed description when taken in conjunction with the drawings, wherein.

Figure 1:
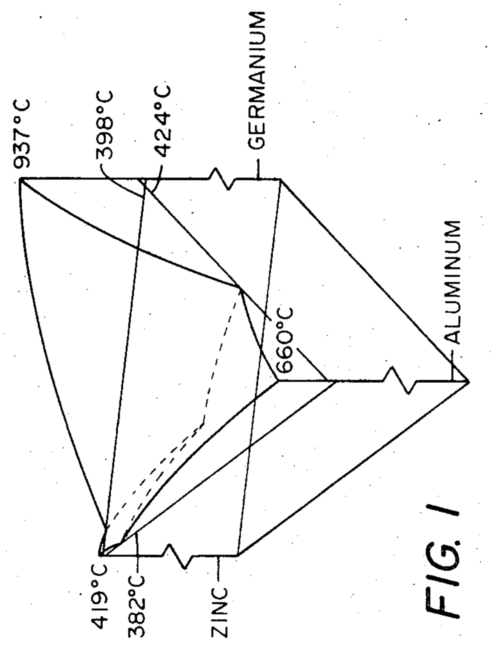
FIG. 1 is a hypothetical phase diagram of the aluminum-germanium-zinc ternary system.

Referring now to the drawings, and particularly to FIG. 1 thereof, a hypothetical phase diagram of the aluminum-germanium-zinc ternary system is shown. The solid lines on the phase diagram are taken from the prior art which establishes the melting points of pure aluminum, pure germanium and pure zinc at 660° C., 937° C. and 419° C., respectively. The prior art further establishes the existence of various binary eutectic alloys comprising these materials, including a 55 wt. percent germanium-45 wt. percent aluminum alloy having a 424° C. melting point, a 94 wt. percent zinc-6 wt. percent germanium alloy having a 398° C. melting point, and a 95 wt. percent zinc-5 wt. percent aluminum alloy having a 382° C. melting point. The dotted lines on the phase diagram represent the "eutectic valleys" that are characteristic of ternary phase diagrams, and also indicate a ternary eutectic at the junction of the eutectic valleys.

Figure 2:
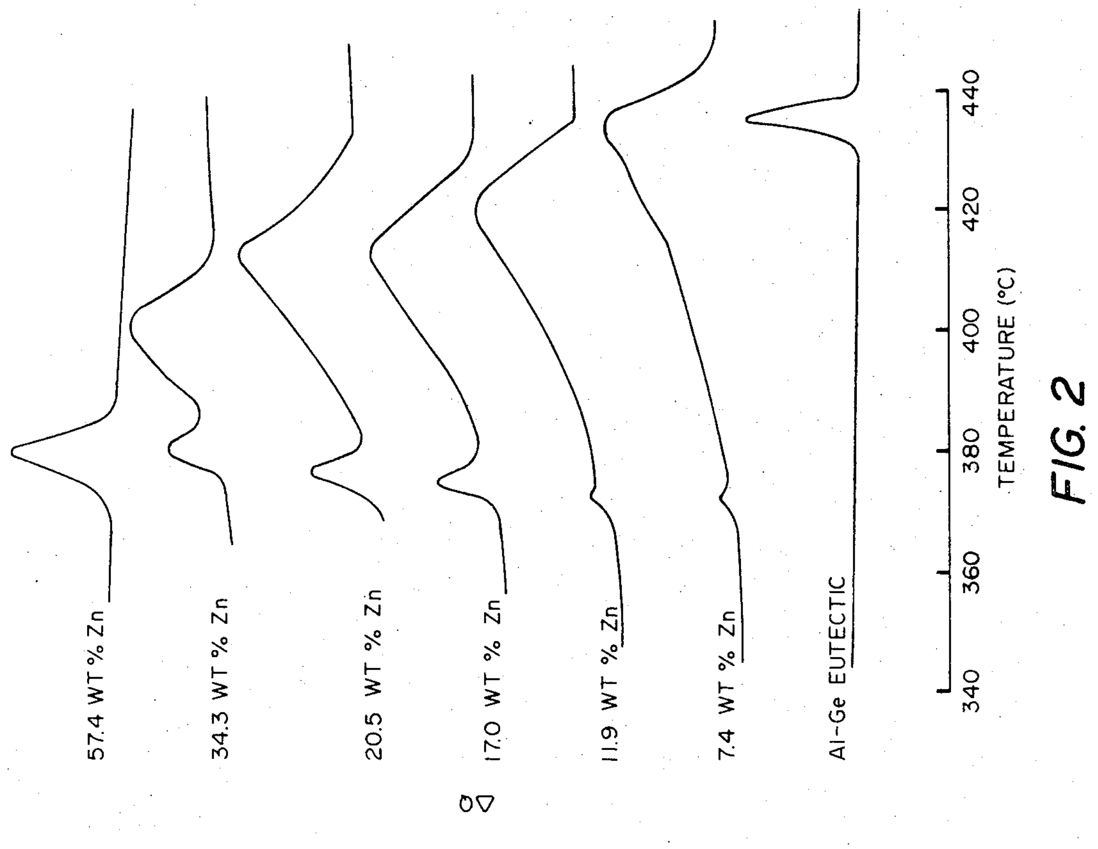
FIG. 2 is a collection of heating curves for various aluminum-germanium-zinc alloys.

Because the aluminum-zinc and the germanium-zinc binary eutectic alloys comprise 95 wt. percent zinc and 96 wt. percent zinc, respectively it was decided to attempt to locate the aluminum-germanium-zinc ternary eutectic alloy by adding zinc to the aluminum-germanium eutectic alloy. Samples were prepared by carefully weighing the elements and then fusing at 900° C. in a non-oxidizing atmosphere. The resulting alloy compositions were then investigated by differential thermal analysis using a Perkin-Elmer Differential Scanning Calorimeter. The results of this investigation are indicated in FIG. 2, wherein the series of differential thermal analysis curves indicating the result of the addition of increasing quantities of zinc to the aluminum-germanium eutectic alloy are shown. The zinc percentages indicated in FIG. 2 were determined by chemical analysis.

The lowermost curve in FIG. 2 is that of the aluminum-germanium binary eutectic alloy. This curve is characteristic of binary eutectic alloys in that it includes a single inflection point. As increasing amounts of zinc are added to the aluminum-germanium eutectic alloy, a second inflection point at about 370° C. is noted. The addition of 57.4 wt. percent zinc to the aluminum-germanium binary eutectic alloy results in a differential thermal analysis curve comprising a single inflection point and indicative of a ternary eutectic having a melting temperature of about 370° C. (atmospheric pressure). Chemical analysis may be employed to establish the composition of the ternary eutectic at about 57 wt. percent zinc, about 23 wt. percent germanium and about 20 wt. percent aluminum.

Figure 3:
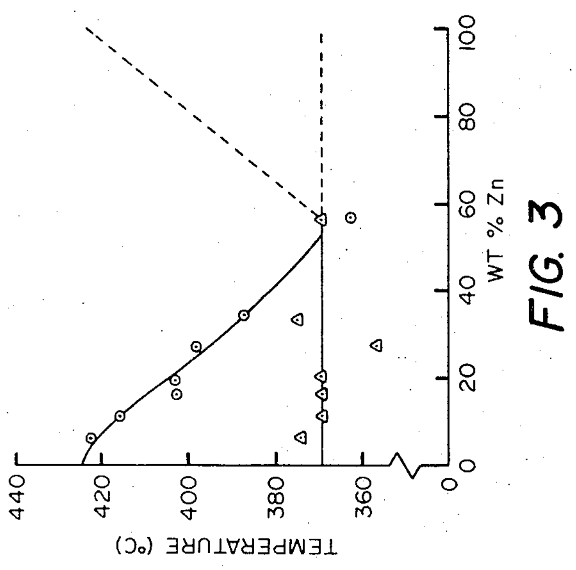
FIG. 3 is a phase diagram showing the results of the addition of increasing quantities of zinc to the aluminum-germanium eutectic alloy.

FIG. 3 comprises a plane section taken along a line extending between the zinc axis and the aluminum-germanium binary eutectic in the ternary phase diagram shown in FIG. 1. The experimental points on the graph indicated by circular and triangular marks are taken from cooling curves and heating curves, respectively. The experimental points establish a phase diagram similar to that of binary eutectic alloy and indicate a eutectic composition comprising approximately 57 wt. percent zinc and approximately 43 wt. percent aluminum-germanium eutectic alloy.

It has been found that aluminum-germanium-zinc ternary alloys are useful as bonding materials. Typically, a quantity of ternary alloy is positioned between a pair of members to be joined, and the resulting assembly is heated to above the melting temperature of the alloy, whereupon the alloy forms a strong bond between the members. Aluminum-germanium-zinc alloys adhere well to a variety of materials and exhibit good mechanical strength. Photomicrographs of bonding materials comprising 20 wt. percent aluminum, 23 wt. percent germanium and 57 wt. percent zinc reveal a microstructure characteristic of eutectic alloys.

Figure 4:
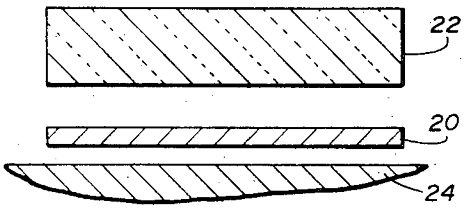
FIGS. 4, 5 and 6 are illustrations of various bonding processes employing the invention.
Figure 5:
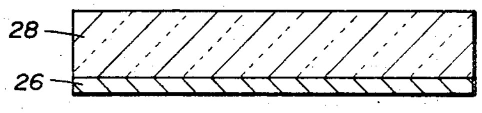
Figure 6:
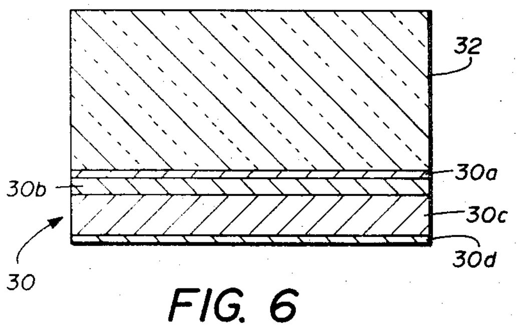

Referring now to FIGS. 4, 5, and 6, various bonding processes employing the invention are shown. In the process illustrated in FIG. 4, a quantity of aluminum-germanium-zinc alloy material is fabricated into an alloy preform 20. The preform 20 is positioned between a semiconductor device 22 and a device receiving member 24, such as a conventional header, heat sink, or the like. In the bonding process illustrated in FIG. 5, an aluminum-germanium-zinc alloy layer 26 is deposited on a semiconductor device 28 by conventional sputtering techniques. The process of FIG. 5 is superior to the process of FIG. 4 in that because the alloy layer is secured to the semiconductor device, it is automatically positioned with the semiconductor device.

The bonding process shown in FIG. 6 is similar to the process shown in FIG. 5 in that an alloy layer 30 is formed on a semiconductor device 32. The process of FIG. 6 differs from the process of FIG. 5 in that the alloy layer 30 is comprised of discrete aluminum, germanium and zinc layers, including an aluminum layer 30*a* deposited on the semiconductor device 32, a germanium layer 30*b* deposited on the aluminum layer, a zinc layer 30*c* deposited on the germanium layer, and an aluminum layer 30*d* deposited on the zinc layer. In the use of the bonding process shown in FIG. 6, the thicknesses of the various layers comprising the alloy layer 30 are adjusted to provide an overall composition corresponding to a desired aluminum-germanium-zinc ternary alloy. An interesting aspect of the invention is that the alloy layer 30 has a melting point corresponding to the melting point of a ternary alloy comprising a homogeneous mixture of all of the material of all of the layers 30*a*, 30*b*, 30*c* and 30*d*.

In each of the foregoing bonding processes, an assembly comprising a semiconductor device, a body of alloy material, and a device receiving members is formed. Then, the resulting assembly is heated to a temperature above the melting temperature of a body of alloy material. It has been found that by heating the assembly to approximately 50° C. above the melting temperature of the body of alloy material, the rapid and efficient melting of the body of alloy material is assured.

Figure 7:
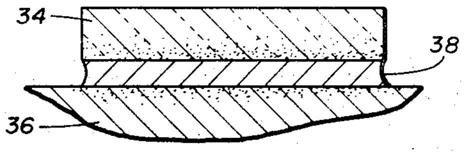
FIG. 7 is an illustration of the result of the use of the processes illustrated in FIGS. 4, 5, and 6.

After the body of alloy material has melted, the semiconductor device of the assembly is scrubbed relative to the device receiving member of penetrate any oxide layers that may be present. The melted alloy material then alloys with the semiconductor device and with the device receiving member to form a strong bond therebetween. The bonds produced by the bonding processes shown in FIGS. 4, 5, and 6 are illustrated in FIG. 7, wherein a semiconductor device 34 is shown bonded to a device receiving member 36 by an alloy layer 38.

Figure 8:
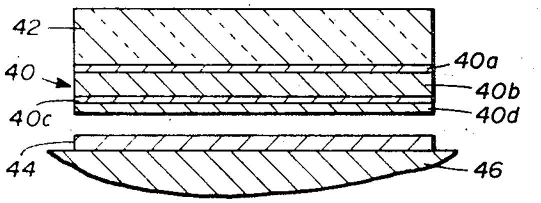
FIGS. 8 and 9 are illustrations of additional bonding processes employing the invention.

Referring now to FIG. 8, another bonding process employing the invention is shown. In the process of FIG. 8, an alloy layer 40 is formed on a semiconductor device 42. The alloy layer 40 is similar to the alloy layer 30 illustrated in FIG. 6 in that it is comprised of an aluminum layer 40*a* formed on the semiconductor device 42, and germanium layer 40*b* formed on the aluminum layer, a zinc layer 40*c* formed on the germanium layer and an aluminum layer 40*d* formed on the zinc layer. The process of FIG. 8 differs from the process of FIG. 6 in that the alloy layer 40 is zinc and germanium-rich. That is, the alloy layer 40 contains more of these materials than is necessary to form a desired aluminum-germanium-zinc alloy.

In accordance with the bonding process of FIG. 8, the remaining aluminum necessary to form the desired aluminum-germanium-zinc ternary alloy is contained in an aluminum layer 44 formed on a device receiving member 46. In the practice of the bonding process, the layer 40 is engaged with the layer 44 and the resulting assembly is heated to a temperature above the melting temperature of an aluminum-germanium-zinc ternary alloy comprising all of the material of all of the layers 40*a*, 40*b*, 40*c*, and 40*d*. When the layer 40 has melted, the semiconductor device 42 is scrubbed relative to the device receiving member 46, whereupon the material of the layer 40 merges with the material of the layer 44 to form an aluminum-germanium-zinc alloy having a desired composition. The combined alloy then alloys with the semiconductor device 42 and with the device receiving member 46 and thereby bonds the semiconductor device to the device receiving member. The result of the bonding process shown in FIG. 8 is identical in appearance to the structure illustrated in FIG. 7.

Figure 9:
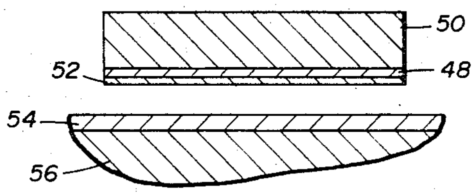

Referring now to FIG. 9, still another bonding process employing the invention is shown. In accordance with the process of FIG. 9, a layer of germanium 48 is formed on a member 50 of any desired composition, and a layer of aluminum 52 is formed on the layer of germanium 48. The aluminum layer 52 is then engaged with the zinc coating 54 of a galvanized member 56, and the resulting assembly is heated to a temperature above the melting temperature of an aluminum-germanium binary alloy containing all of the material of the layer 48 and all of the material of the layer 52.

When the layers 48 and 52 have melted, the member 50 is scrubbed relative to the member 56, whereupon the layers 48, 52 and 54 merge to form an aluminum-germanium-zinc ternary alloy. The ternary alloy is then allowed to cool, whereupon a bonded structure similar in appearance to the structure illustrated in FIG. 7 is formed.

Figure 10:
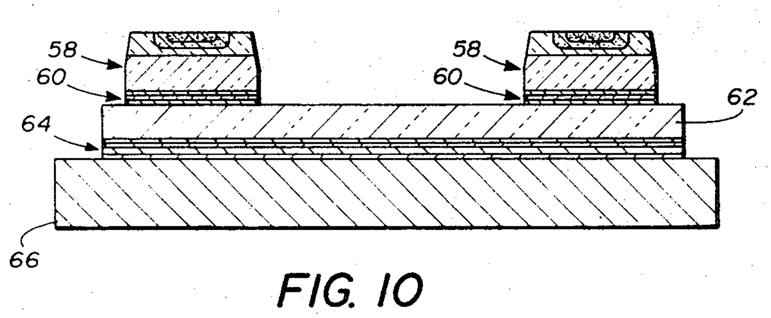
FIG. 10 is an illustration of an electronic device bonding process employing the invention.

An electronic device bonding process employing the invention is illustrated in FIG. 10. Initially, a slice of semiconductor material is fabricated in accordance with conventional electronic device manufacturing techniques to form a plurality of finished semiconductor chips. Then, one side of the slice is coated with an aluminum-germanium binary alloy layer which preferably comprises the aluminum-germanium eutectic alloy. These preliminary steps result in a plurality of individual semiconductor chips 58 each having an aluminum-germanium binary alloy layer 60 formed on it.

The layer 60 of at least one of the chips 58 is then engaged with a chip receiving substrate 62, which may be comprised of metallized aluminum oxide, or any other convenient material. The resulting subassembly is then heated to a temperature about 50° C. above the melting temperature of the alloy 60. When the layer 60 has melted, the chip 58 is scrubbed relative to the substrate 62, whereupon the alloy layer forms a strong bond between the chip 58 and the substrate 62.

After the chip-substrate subassembly is formed, a body of aluminum-germanium-zinc alloy material 64 is positioned between the substrate 62 and the substrate receiving member 66, which may be comprised of nickel or any other convenient material. The body of ternary alloy 64 preferably comprises the eutectic ternary alloy, and may be formed in accordance with any of the bonding processes illustrated in FIGS. 4 ,5 and 6. The chip-substrate-receiving member assembly is then heated to a temperature about 50° C. above the melting temperature of the body of ternary alloy 64.

Assuming that the aluminum-germanium binary eutectic alloy is employed to bond the chip 58 to the substrate 62, the melting temperature of the alloy layer 60 is 424° C. Assuming further the aluminum-germanium-zinc ternary eutectic alloy is employed to form the body of ternary alloy 64, the melting temperature of the body of ternary alloy is 370° C. It is desirable to heat an alloy layer to about 50° C. above its melting temperature in order to assure the rapid and efficient melting of the alloy layer. However, this creates no problem in the bonding process illustrated in FIG. 10, since the body of ternary alloy 64 may be heated to 420° C., that is, to the temperature 50° C. above its melting temperature, without melting the material of the alloy layer 60.

When the body of ternary alloy material 64 is melted, the substrate 62 is scrubbed relative to the receiving member 66 to penetrate any oxide layers that may be formed on the receiving member 66 or on the body of ternary alloy 64. The ternary alloy thereupon alloys with the substrate 62 and with the receiving member 66 to form a strong bond therebetween. The resulting structure is similar in appearance to the structure shown in FIG. 7.

In accordance with the present invention, a bonding material comprises an alloy of aluminum, germanium and zinc. The use of the material is advantageous in that the ternary eutectic alloy comprising 20 wt. percent aluminum, 23 wt. percent germanium and 57 wt. percent zinc has a melting temperature of 370° C. which is below both the 400° C. temperature that is injurious to some devices and the 424° melting temperature of the aluminum-germanium eutectic alloy. The use of the material is further advantageous in that the material is readily adapted to high volume production techniques, in that the material adheres readily both to semicondutcor devices and to device receiving members, and in that a material exhibits good mechanical strength.

Although specific embodiments of the invention are illustrated in the drawing and described in the foregoing specification, it will be understood that the invention is not limited to the disclosed embodiments, but is capable of various modifications, rearrangements and substitutions without departing from the spirit of the invention.

What is claimed is:

1. A semiconductor assembly comprising a semiconductor body bonded ot a receiving member by means of an alloy consisting essentially of aluminum, germanium, and zinc.

2. The bonded structure according to claim 1 wherein the aluminum-germanium-zinc alloy comprises 20 wt. percent aluminum, 23 wt. percent germanium and 57 wt. percent zinc.

3. The bonded structure according to claim 1 wherein one of the members is a subassembly including a binary aluminum-germanium eutectic alloy bond.

References Cited

UNITED STATES PATENTS

| | | | |
|---|---|---|---|
| 2,196,034 | 4/1940 | Schulze | 75—178 A |
| 2,659,138 | 11/1953 | Stroup | 75—134 GX |
| 3,140,536 | 7/1964 | Kuznetzoff | 75—134 GX |
| 3,600,144 | 8/1971 | Csakvary | 29—195 |

L. DEWAYNE RUTLEDGE, Primary Examiner

E. L. WEISE, Assistant Examiner

U.S. Cl. X.R.

29—473.1, 500; 75—134 G, 146, 178 A